United States Patent
Forney et al.

(10) Patent No.: US 9,629,254 B2
(45) Date of Patent: Apr. 18, 2017

(54) MULTI-FUNCTION EPOXY CASTING RESIN SYSTEM

(71) Applicant: Plasma Systems Holdings, Inc., San Jose, CA (US)

(72) Inventors: Michael Forney, San Jose, CA (US); James Stameson, San Jose, CA (US)

(73) Assignee: PLASMA SYSTEMS HOLDINGS, INC., San Jose, CA (US)

( * ) Notice: Subject to any disclaimer, the term of this patent is extended or adjusted under 35 U.S.C. 154(b) by 465 days.

(21) Appl. No.: 14/208,144

(22) Filed: Mar. 13, 2014

(65) Prior Publication Data

US 2014/0272328 A1     Sep. 18, 2014

Related U.S. Application Data

(60) Provisional application No. 61/799,248, filed on Mar. 15, 2013.

(51) Int. Cl.
| | | |
|---|---|---|
| *H05K 3/28* | (2006.01) | |
| *C08G 59/68* | (2006.01) | |
| *H05K 1/03* | (2006.01) | |

(52) U.S. Cl.
CPC .......... *H05K 3/285* (2013.01); *C08G 59/686* (2013.01); *H05K 1/0326* (2013.01); *H05K 2201/012* (2013.01); *H05K 2201/0209* (2013.01); *Y10T 428/24802* (2015.01)

(58) Field of Classification Search
CPC ....................................................... H05K 3/285
See application file for complete search history.

(56) References Cited

U.S. PATENT DOCUMENTS

| | | | |
|---|---|---|---|
| 6,030,713 A | 2/2000 | Hollstein et al. | |
| 2003/0195324 A1 | 10/2003 | Burton et al. | |
| 2004/0143079 A1* | 7/2004 | Coca ........................ | C08F 8/00 |
| | | | 526/234 |
| 2009/0036582 A1 | 2/2009 | Muller-Frischinger | |
| 2011/0152448 A1 | 6/2011 | Corley et al. | |
| 2011/0166259 A1* | 7/2011 | Butikofer ............... | C08G 59/18 |
| | | | 523/401 |
| 2012/0010329 A1 | 1/2012 | Hunter et al. | |
| 2012/0225187 A1 | 9/2012 | Lienert et al. | |

(Continued)

FOREIGN PATENT DOCUMENTS

| | | |
|---|---|---|
| CN | 102533192 A | 7/2012 |
| EP | 0459951 | 12/1991 |
| WO | WO 2012-158292 | 11/2012 |

OTHER PUBLICATIONS

PCT Search Report and Written Opinion re International Application No. PCT/US2014/025503 dated Jul. 17, 2014, in 15 pages.

(Continued)

*Primary Examiner* — Megan McCulley
(74) *Attorney, Agent, or Firm* — Knobbe Martens Olson and Bear LLP (57) ABSTRACT

Disclosed herein are embodiments of an epoxy casting resin system which can be used to at least partially cover an electronic component or mechanism. In some embodiments, the epoxy resin can have a low viscosity, while maintaining advantageous physical, thermal, and electrical properties. Further described are methods for making embodiments of the epoxy casting resin.

21 Claims, 2 Drawing Sheets

(56) References Cited

U.S. PATENT DOCUMENTS

| | | | |
|---|---|---|---|
| 2012/0270967 A1* | 10/2012 | Burckhardt | C08G 59/4042 |
| | | | 523/400 |
| 2012/0296013 A1 | 11/2012 | Timberlake et al. | |
| 2013/0237681 A1* | 9/2013 | Burckhardt | C08G 59/504 |
| | | | 528/68 |
| 2014/0288247 A1* | 9/2014 | Burckhardt | C08G 59/184 |
| | | | 525/523 |
| 2014/0309334 A1* | 10/2014 | Kramer | C08G 59/50 |
| | | | 523/400 |

OTHER PUBLICATIONS

"Microelectronics Packaging Handbook" ($2^{nd}$ Edition), by Tummala, R.R (U.S.), translated by Electronics Packaging Professional Committee of The Chinese Institute of Electronics, published by Publishing House of Electronics Industry of China, $1^{st}$ Edition, pp. 617-618.

\* cited by examiner

MULTI-FUNCTION EPOXY CASTING RESIN SYSTEM

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field of the Invention

The present disclosure generally relates to materials for potting and encapsulating electronic components, and more particularly, relates to a multi-function and highly adaptable epoxy casting resin system designed for various applications in both indoor and outdoor environments.

Description of the Related Art

A wide range of materials have been developed for potting and encapsulating electronic components. For example, materials made of epoxy resin are commonly used as potting compound in printed circuit board applications. While there is a variety of commercially available potting and encapsulation systems, there are drawbacks associated with each. For example, many currently used epoxies do not have sufficient thermal conductivity for use with electrical components which achieve high temperatures. Further, the epoxies that do achieve high thermal conductivity do so at the expense of other properties, such as strength, toughness, or electrical permittivity. Accordingly, there is a need for an improved epoxy casting resin system with desired properties.

SUMMARY

Disclosed herein is an uncured epoxy resin which can comprise 15-26 wt. % of at least one epoxy resin base reactive constituent, 2-5 wt. % of diluent, 0.5-1.5 wt. % of at least one color pigment, 40-60 wt. % of at least one thermally conductive filler, 2.5-4.0 wt. % of at least one reactive constituent, 8.5-16 wt. % of at least one flame retardant, 5-10 wt. % of at least one reactive agent, and 1-3 wt. % catalyst.

In some embodiments, the viscosity of the resin can be 3,500-4500 cP mixed measured at 24° C.

In some embodiments, the at least one epoxy resin base reactive constituent can comprise bisphenol F epoxy resin, the at least one diluent can comprise butyl glycidyl ether, the at least one color pigment can comprise epoxy carbon black dispersion, the at least one thermally conductive filler can comprise aluminum oxide, the at least one reactive constituent can comprise phosphorous salt, the at least one flame retardant can comprise 7%-12% alumina trihydrate and 1.5%-4% ammonium poly phosphate, the at least one reactive agent can comprise polyglycol diamine, and the at least one catalyst can comprise polyamine blend.

In some embodiments, the uncured epoxy resin can consist essentially of about 15%-26% bisphenol F epoxy resin, about 2%-5% butyl glycidyl ether, about 0.5%-1.5% epoxy carbon black dispersion, about 40%-60% aluminum oxide, about 2.5%-4% phosphorous salt, about 7%-12% alumina trihydrate, about 1.5%-4% ammonium poly phosphate, about 5%-10% polyglycol diamine, and about 1%-3% of polyamine blend.

In some embodiments, the uncured epoxy resin can consist essentially of about 19.2% bisphenol F epoxy resin, about 3.4% butyl glycidyl ether, about 0.75% epoxy carbon black dispersion, about 54% aluminum oxide, about 3.4% phosphorous salt, about 9% alumina trihydrate, about 2.3% ammonium poly phosphate, about 6.8% polyglycol diamine, and about 1.4% of polyamine blend.

In some embodiments, the aluminum oxide can have a mesh size of less than 325 Mesh. In some embodiments, the aluminum oxide can have a mesh size of less than 50 Mesh.

In some embodiments, the resin can comprise about 17.2%-21.2% bisphenol F epoxy resin, about 2.4%-4.4% butyl glycidyl ether, about 0.5%-1.0% epoxy carbon black dispersion, about 51%-57% aluminum oxide, about 2.5%-4% phosphorous salt, about 7%-11% alumina trihydrate, about 1.5%-3.3% ammonium poly phosphate, about 5%-8.8% polyglycol diamine; and about 1%-1.9% of polyamine blend.

In some embodiments, the resin can comprise about 19.2% bisphenol F epoxy resin, about 3.4% butyl glycidyl ether, about 0.75% epoxy carbon black dispersion, about 54% aluminum oxide, about 3.4% phosphorous salt, about 9% alumina trihydrate, about 2.3% ammonium poly phosphate, about 6.8% polyglycol diamine, and about 1.4% of polyamine blend.

In some embodiments, the bisphenol F epoxy resin can have a purity of at least 95%. In some embodiments, the bisphenol F epoxy resin can have a purity of at least 99%.

In some embodiments, a cured epoxy can be formed from the epoxy resin.

In some embodiments, the cured resin can have a thermal conductivity of 0.70 W/(m·K) at 60° C. In some embodiments, the cured resin can have a volume resistivity of $3.95 \times 10^{15}$ ohm·cm. In some embodiments, the cured resin can have a relative temperature index for impact, strength, and electrical of 130° C. In some embodiments, the cured resin can have a 200 g. pot life of 1 to 2 hours at 25° C.

Also disclosed herein is a printed circuit board which can comprise at least one electronic component, the electronic component being at least partially covered by an epoxy resin and/or cured epoxy comprising 15-26 wt. % of at least one epoxy resin base reactive constituent, 2-5 wt. % of diluent, 0.5-1.5 wt. % of at least one color pigment, 40-60 wt. % of at least one thermally conductive filler, 2.5-4.0 wt. % of at least one reactive constituent, 8.5-16 wt. % of at least one flame retardant, 5-10 wt. % of at least one reactive agent, and 1-3 wt. % catalyst.

In some embodiments, the at least one epoxy resin base reactive constituent can comprise bisphenol F epoxy resin, the at least one diluent can comprise butyl glycidyl ether, the at least one color pigment can comprise epoxy carbon black dispersion, the at least one thermally conductive filler can comprise aluminum oxide, the at least one reactive constituent can comprise phosphorous salt, the at least one flame retardant can comprise 7%-12% alumina trihydrate and 1.5%-4% ammonium poly phosphate, the at least one reactive agent can comprise polyglycol diamine, and the at least one catalyst can comprise polyamine blend.

In some embodiments, the resin can comprise about 17.2%-21.2% bisphenol F epoxy resin, about 2.4%-4.4% butyl glycidyl ether, about 0.5%-1.0% epoxy carbon black dispersion, about 51%-57% aluminum oxide, about 2.5%-4% phosphorous salt, about 7%-11% alumina trihydrate, about 1.5%-3.3% ammonium poly phosphate, about 5%-8.8% polyglycol diamine, and about 1%-1.9% of polyamine blend.

In some embodiments, the resin can comprise about 19.2% bisphenol F epoxy resin, about 3.4% butyl glycidyl ether, about 0.75% epoxy carbon black dispersion, about 54% aluminum oxide, about 3.4% phosphorous salt, about 9% alumina trihydrate, about 2.3% ammonium poly phosphate, about 6.8% polyglycol diamine, and about 1.4% of polyamine blend.

Also disclosed herein is a method of producing a casting epoxy which can comprise producing component A by combining about 15%-26% bisphenol F epoxy resin, about 2%-5% butyl glycidyl ether, about 0.5%-1.5% epoxy carbon black dispersion, about 40%-60% aluminum oxide, about 2.5%-4% phosphorous salt, about 7%-12% alumina trihydrate, and about 1.5%-4% ammonium poly phosphate, producing component B by combining about 5%-10% polyglycol diamine, and about 1%-3% of polyamine blend, combining component A with component B to form an uncured resin, and curing the uncured resin to form a cured resin.

In some embodiments, the cured resin can have greater than or equal to 95% of full properties after 36 hours at 25° C. In some embodiments, the cured resin can have greater than or equal to 95% of full properties after 2 hours at 60° C. In some embodiments, the uncured resin can have a viscosity of 3,500-4,500 prior to curing.

DETAILED DESCRIPTION

Embodiments of the present invention provide a multi-function, highly adaptable material that can be used in various potting and encapsulation applications for both indoor and outdoor environments. In various embodiments, the material is an epoxy resin, cured epoxy, and/or epoxy casting resin system/epoxy resin system. The epoxy resin system can describe both the epoxy resin and/or the cured epoxy. The composition of the epoxy casting resin system can be formulated to achieve a combination of different desired properties without adversely affecting material performance. Specifically, embodiments of the disclosed epoxy resin system can have a high quantity of thermal conductive filler such as aluminum oxide and yet, still exhibit low mix viscosity and good physical strength. In certain embodiments, the epoxy resin system can provide a filled, medium viscosity, self-extinguishing flame retardant, low stress, thermally conductive material.

Embodiments of the disclosed epoxy resin system can be advantageous over other currently commercially available epoxies. For example, currently used epoxies can have insufficient thermal conductivity, electrical performance, and physical performance. If one of these properties were improved to sufficient levels, the other properties tend to decrease, thus making the commonly used epoxies not as desirable. However, as further described below, embodiments of the disclosed material can have about 24% better thermal conductivity than current aluminum oxide based epoxies on the market. Further, embodiments of the disclosed cured epoxy can have about 9.5% better electrical conductivity than current aluminum oxide based epoxies on the market. In addition, embodiments of the disclosed cured epoxy can have about 10-20% better physical performance than current aluminum oxide based epoxies on the market.

While advantageous properties, such as thermal conductivity, achieved by the disclosed material can be obtained through the use of non-aluminum oxide filled epoxies, such as through the use of boron nitride, these are significantly more expensive. Accordingly, the disclosed material is a cost effective approach that has improved properties advantageous over other epoxies in its class.

In some embodiments, the disclosed material is an epoxy resin and/or cured epoxy that can have a full balance of enhanced material properties while maintaining adequate viscosity, thereby avoiding sacrificing ease of application which can happen to other resins on the market. For example, the disclosed material can have a low mixed viscosity, and is among the lowest commercially available for such a heavily thermally filled epoxy. Further, as discussed in detail below, embodiments of the disclosed material can have high thermal conductivity, increased strength (adhesive, physical, tensile, compressive, cohesive, etc.), low stress, and long pot life. In addition, embodiments of the disclosed material can have flexible ambient and thermal cure schedules. Further, embodiments of the disclosed material can have adjustable physical properties. Many of the current epoxies on the market cannot produce an cured epoxy and/or epoxy resin with the same properties as embodiments of the disclosed material.

Embodiments of the disclosed material can also have advantageous electrical properties, such as a low dielectric constant for such a heavily filled thermal management epoxy resin system, a high dielectric strength especially for a heavily filled thermal management epoxy resin system, and great electrical resistance.

Epoxy

Epoxide functional groups, or epoxy resins, can be cured to form epoxies or cured epoxies. These epoxy resins, or polyepoxides, are a class of reactive prepolymers and polymers which contain epoxide groups. Typically, these epoxy resins react, thereby forming cross links, through a number of different processes. For example, catalytic homopolymerization can be used to react an epoxy resin with itself. Further, co-reactants (known as hardeners or curatives), such as polyfunctional amines, acids, acid anhydrides, phenols, alcohols, and thiols can all be used to react epoxy resins.

The reaction that takes place in an epoxy resin can form cross-links, thereby solidifying the epoxy resin into a final product, known as an epoxy or cured epoxy. The cross-linking reaction can also be known as curing. In some embodiments, the final epoxy can have improved physical properties, such as high temperature and chemical resistance.

Epoxy Resin Composition

In some embodiments, the composition of an epoxy casting resin system can include many different components. While certain compositions are described below, a person skilled in the art would understand substitutions could be made for equivalent materials.

In some embodiments, the epoxy resin can contain an epoxy resin base reactive constituent. In come embodiments, about 15%-26% by weight of the epoxy resin base reactive constituent can be used. For example, the epoxy resin base reactive constituent can be bisphenol F epoxy resin. In one embodiment, the bisphenol F epoxy resin can be high performance/high purity grade. In some implementations, the bisphenol F epoxy can have a dimer content of greater than about 95%, 98%, or 99%.

In some embodiments, a diluent can also be used in the epoxy resin. The diluent can act as a diluting agent, which can decrease the viscosity of the substance, such as fluid, that the diluent is incorporated into. In some embodiments, the diluent can also be used in the process of solvent extraction. In some embodiments, about 2%-5% by weight of diluent can be used. In some embodiments, the diluent can be butyl glycidyl ether.

Embodiments of the disclosed epoxy resin can also be colored. In some embodiments, color pigments can be added into the resin to change or modify the color of the resin. In some embodiments, the color pigment does not affect the physical properties of the resin or final cured epoxy. In some embodiments, the color pigment can affect the physical properties of the resin or final cured epoxy. In some embodiments, about 0.5%-1.5% by weight of color pigments can be used. In some embodiments, a color dispersion, such as an epoxy carbon black dispersion, can be used. However, other types of coloring can be used, such as liquid dyes, and the type of coloring is not limiting. Further, other colors can be used, and the type of color used is not limiting.

Embodiments of the disclosed epoxy resin can also contain thermally conductive filler. In some embodiments, about 40%-60% by weight of thermally conductive filler can be used. For example, aluminum oxide can be used as the thermally conductive filler. In some embodiments, the aluminum oxide can have a purity of at least about 95%, 98%, or 99%. In some embodiments, the aluminum oxide can have an average particle size of less than about 50 Mesh, 150 Mesh, 325 Mesh or 400 Mesh. Typically, the use of such a high percentage of thermally conductive filler can lead to an epoxy resin that is so thick that it cannot be used. Advantageously, embodiments of the disclosed epoxy resin can be well filled with the thermally conductive filler, thereby maintaining high thermal conductance, while still having acceptable viscosity levels, as further discussed below.

In some embodiments, about 2.5%-4% by weight of a reactive constituent can also be used. For example, phosphorous salt or organophosphorous salt can be used. The phosphorous salt can be used as a flame retardant, which can allow the resin to have self-extinguishing characteristics. Further, the use of the salt can lend to thermal conductivity and structural integrity of the cured resin.

In some embodiments, about 8.5%-16% by weight of flame retardant can be used as well. For example, flame retardants such as alumina trihydrate and ammonium polyphosphate can be used, either alone or in combination. In some embodiments, the alumina trihydrate can have a purity of at least about 95%, 98%, or 99%. In some embodiments, the ammonium polyphosphate can have a purity of at least about 95%, 98%, or 99%. However, other flame retardants can be used and the type of flame retardant is not limiting. In some embodiments, about 7-12 wt. % alumina trihydrate can be used, and about 1.5-4 wt. % ammonium polyphosphate can be used. In some embodiments, the alumina trihydrate and ammonium polyphosphate can have low particle size and low viscosity.

In some embodiments, about 5%-10% by weight of a reactive agent can be used. For example, polyglycol diamine can be used as the reactive agent. In some embodiment, the polyglycol diamine can be high performance/high purity grade. For example, in some embodiments the polyglycol diamine can have a purity of greater than 95%, 98%, or 99%. In some embodiments, the polyglycol diamine can have low viscosity. The polyglycol diamine can be used as a curative agent (reactant) so as to bring about the reactive process which can result in the curing and cross-linking of the epoxy resin.

In some embodiments, about 1%-3% by weight of a reactive agent/catalyst can be used. For example, a polyamine blend can be used. The polyamine blend can be used as a curative agent (reactant) so as to bring about the reactive process which can result in the curing and cross-linking of the epoxy resin. Specifically, the polyamine blend can be a reactive agent utilized primarily as a catalyst to initiate and promote the curing of the epoxy resin. Further, the polyamine blend can allow for the resin to be cured at room temperature and can improve short thermal cure cycles.

An embodiment of a composition of the disclosed epoxy resin and/or cured epoxy is listed below in table 1.

TABLE 1

Epoxy Resin Composition

| Material (Generic Name) | Grade (Generic) | Description Primary Function | Material Percentage |
|---|---|---|---|
| Bisphenol F Epoxy Resin | High Performance High Purity Aerospace Grade | Epoxy Resin Base Reactive Constituent | 19.2% +/− 2% by wt. |
| Butyl Glycidyl Ether | Low Viscosity | Reactive Diluent | 3.4% +/− 1% by wt. |
| Epoxy Carbon Black Dispersion | High Dispersion | Color Pigment | 0.75% +/− 0.25% by wt. |
| Aluminum Oxide | Moderate/High Purity Moderate/High Mesh (smaller particle size) High Density | Thermally Conductive Filler | 54% +/− 3% by wt. |
| Phosphorous Salt | High Purity | Reactive Constituent | 3.4% +/− 1% by wt. |
| Alumina Trihydrate | Moderate/High Purity Moderate/High Mesh (smaller particle size) | Flame Retardant | 9% +/− 2% by wt. |
| Ammonium Polyphosphate | Moderate/High Purity Moderate/High Mesh | Flame Retardant | 2.3% +/− 1% by wt. |
| Polyglycol Diamine | Low Viscosity High Performance High Purity Aerospace Grade | Reactive Agent | 6.8% +/− 2% by wt. |
| Polyamine Blend | High Performance | Reactive Agent/Catalyst | 1.4% +/− 0.5% by wt. |

In some embodiments, as described below, the final cured resin can be formed by the mixing of two parts including different materials. These parts can be a resin part (Part A) and a hardener part (Part B). These parts can be mixed together to begin the reaction process. In some embodiments, the bisphenol F epoxy resin, butyl glycidyl ether, epoxy carbon black dispersion, aluminum oxide, phosphorous salt, alumina trihydrate, and ammonium poly phosphate can be Part A, and polyglycol diamine and polyamine blend can be Part B.

Epoxy Resin and Cured Epoxy Properties

The disclosed epoxy resin system can have numerous advantageous properties. For example, embodiments of the disclosed epoxy resin system can be a medium viscosity, self-extinguishing flame retardant, low stress, thermally conductive epoxy resin system.

Further, embodiments of the disclosed epoxy resin system can be RoHS compliant. In addition, embodiments of the disclosed epoxy resin system can be UL 94V0 rated, and can meet the physical security requirements of FIPS 140-2, and FIPS 140-3 for encapsulating material.

In some embodiments, the disclosed epoxy resin system can provide for good whisker, such as tin-whisker, mitigation properties. In some embodiments, the disclosed epoxy resin system can have good resistance to water, salt spray, inorganic acids, bases, and most organic solvents. Accordingly, embodiments of the epoxy resin system can be used both indoors and outdoors.

In some embodiments, the resin can exhibit good wetting and adhesion to most surfaces. Further, the resin can be free flowing to penetrate voids and provide good air release.

In some embodiments, the resin can contain a flame retardant package and thermal conductive fillers which can settle over time. In some embodiments, the resin has good resistance to hard settling.

Further described are some properties of embodiments of the resin system. All properties are at 25° C. unless noted otherwise. Table 2 illustrates some of the physical properties of the uncured resin. Table 3 illustrates some of the physical properties of embodiments of the cured resin. Table 4 illustrates some of the thermal properties of embodiments of the cured resin. Table 5 illustrates some of the electrical properties of embodiments of the cured resin. In all of the below tables, the numeric values should be understood to include the term about or approximately.

TABLE 2

| Uncured Properties | |
|---|---|
| Specific Gravity | |
| Part A | 2.16 |
| Part B | 0.97 |
| Mixed | 1.97 |
| Viscosity, cP (mixed measured at 24° C.) | 3,500-4,500 |
| Color (standard mixed color) | Black |
| Shelf Life | 12-18 months |

TABLE 3

| Physical Properties | |
|---|---|
| Hardness, Shore D (ASTM D2240-05) | 86-92 |
| Service Temperature, ° C. | |
| Continuous | −55 to 200 |
| Intermittent | −65-260 |
| Tensile Strength, psi @ 25° C. (ASTM D 638-10) | |
| Ambient cure, 7 days @ 20° C. | 6000 (nominal) |
| Heat Cure, 2 hours @ 60° C. | 6750 (nominal) |
| Tensile Elongation % @ break (ASTM D 638-10) | |
| Ambient cure, 7 days @ 20° C. | 0.70-2.00 |
| Heat Cure, 2 hours @ 60° C. | 0.70-2.00 |
| Tensile Modulus, psi @ 25° C. (ASTM D 638-10) | |
| Ambient cure, 7 days @ 20° C. | 1098000 (nominal) |
| Heat Cure, 2 hours @ 60° C. | 1167000 (nominal) |

TABLE 3-continued

| Physical Properties | |
|---|---|
| Compressive Strength, psi @ 25° C. | |
| Ambient cure, 7 days @ 20° C. | 23,500 (nominal) |
| Heat Cure, 2 hours @ 60° C. | 24,000 (nominal) |
| Shear Strength, psi @ 25° C. (ASTM D 638-10) | |
| Ambient cure, 7 days @ 20° C. | 4500 (nominal) |
| Heat Cure, 2 hours @ 60° C. | 5160 (nominal |
| Izod Impact, ft. lbs./in. of notch | 1.2 |
| Heat Distortion, ° C. | 160-170 |
| Water Absorption, % (ASTM D 570-98) | 0.3-0.4 |
| Linear Shrinkage, in/in | Less than or equal to 0.002 |
| Relative Temperature Index (RTI) Impact ° C. | 130 |
| Relative Temperature Index (RTI) Strength ° C. | 130 |

TABLE 4

| Thermal Properties | |
|---|---|
| Thermal Conductivity, W/(m · K) (ASTM E 1530-11) | 0.70 @ 60° C. |
| Coefficient of Thermal Expansion, in/in/° C. × $10^{-6}$ | 40* |

*Asterisk denotes values considered typical to associated resin systems or extrapolated from other test results.

TABLE 5

| Electrical Properties | |
|---|---|
| Volume Resistivity, ohm · cm (ASTM D 257-07) | $3.95 \times 10^{15}$ |
| Relative Temperature Index (RTI) Electrical ° C. | 130 |
| Comparative Tracking Index (CTI) | 0 |
| Dielectric Constant | |
| @ 100 kHz | 4.69 |
| @ 1 MHz | 4.80 |
| Dissipation Factor | |
| @ 100 kHz | 0.017 |
| @ 1 MHz | 0.018 |
| Dielectric Strength, V/mil | 525-575 (nominal) |
| 0.003" thickness, V/mil | 1,000-1,500 |
| 0.125" thickness, V/mil | 535-670 |

As embodiments of the disclosed epoxy resin system can be considered heavily filled (e.g. having high amounts of thermal fillers), it is unexpected that the disclosed resin achieves lower permittivity than comparably filled resins. Typically, adding thermal fillers into an epoxy resin system causes the electrical permittivity to increase, sometimes drastically. Advantageously, the disclosed cured epoxy does not have this negative effect.

Further, embodiments of the disclosed resin have impact, strength, and electrical RTIs of 130° C. The RTI temperature indicates the maximum service temperature for a material where specific properties are not unacceptably compromised, generally defined as having greater than 50% of its typical properties. Most epoxies currently in use have a RTI of 90° C. Accordingly, embodiments of the disclosed resin have an advantageously high RTI, which allows the resin to hold its properties for longer at higher temperatures.

In some embodiments, the disclosed epoxy resin system can have a flammability of V-0 (BK) under IEC 60695-11-10. Further, the resin can have a high-voltage arc tracking rate of 0 and a dimension stability % of 0. The 0 results indicate that the material passed the tests at the top level.

Method of Making

Figure 1:
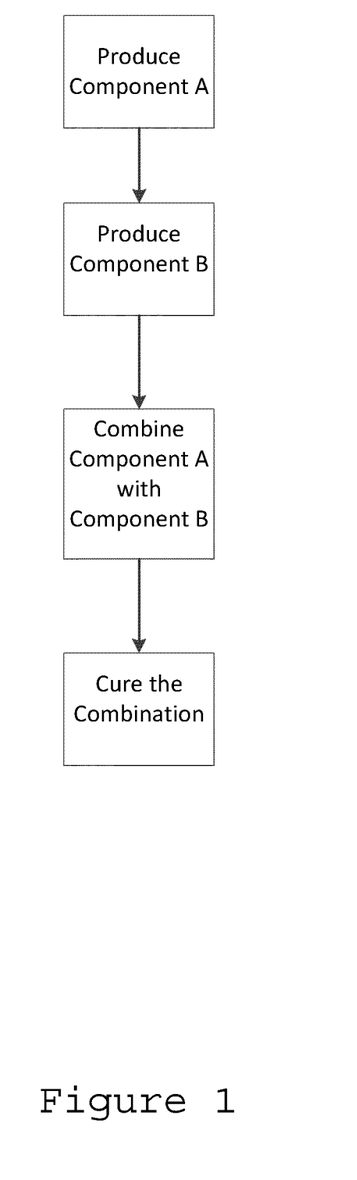
FIG. 1 shows an embodiment of a method for forming a cured epoxy.

In some embodiments, Part A and Part B of the disclosed epoxy resin can be formed separately. FIG. 1 illustrates an embodiment of a method for making a cured epoxy.

For Part A, the resin (for example the bisphenol F), diluent (for example the butyl glycidyl ether), and pigment (for example the carbon black dispersion) can be blended together at low and high speeds to shear. This blending can be done for approximately 5 minutes. After this initial blending, a reactive constituent (for example phosphorous salt) can be added to the mixture. This can then be blended together at low and high speeds of shear. In some embodiments, the high blending speed of this step is approximately 60% faster than the high blending speed of the first step. This blending can be done for approximately 5 minutes. After blending, flame retardant (for example the aluminum trihydrate) can be added to the mixture. This can then be blended together at low and high speeds of shear. This blending can be done for approximately 5 minutes. Following, more flame retardant (for example the ammonium poly phosphate) can be added to the mixture. This can then be blended together at low and high speeds of shear. This blending can be done for approximately 5 minutes. After blending, portions of the thermal filler (for example the aluminum oxide) can be added. In some embodiments, only a portion of the thermal filler is added, then blended, and then another portion of thermal filler is added, and then blended, until all thermal filler is added. For example, the portions can be about 10, 20, 30, 40, or 50% of the thermal filler. This can then be blended together at low and high speeds of shear. This blending can be done for approximately 5 minutes. Afterwards, the entire mixture can be blended under low and high speed shear under vacuum. This vacuum blending can be done for approximately 15 minutes. In some embodiments, a machine used for blending can be cleaned after each step. A person having skill in the art would understand that other basic methods of producing the resin could be used, and the method is not limiting.

In some embodiments, a different method for forming Part A can be used. Instead of waiting until the end to add the thermal filler, a portion of the thermal filler can be blended along with the resin, diluent, and pigment in the first step. For example, approximately 70, 75, or 80% of the total thermal filler can be added. The remaining thermal filler is added at the end as describe above. This method can be advantageous as it can provide for better dispersion and wetting of the thermal filler in the epoxy resin. Further, it can reduce the likelihood of soft settling. In addition, this method can use less diluent (a solvent), thus allowing for a greener material.

In some embodiments, Part B can be formed by mixing together the reactive agents and catalyst (for example the polyamine blend and the polyglycol diamine). These reactive agents and catalysts can be in liquid form. In some embodiments, the reactive agents and catalysts can be blended at medium speeds for about 10 minutes.

To begin the curing process, in some embodiments, Part A and Part B can be mixed together. In some embodiments, mix ratio of Part A to B can be, by weight, 10.00 to 1 (variable up to 12:1). In some embodiments, mix ratio of Part A to B can be, by volume, 5.00 to 1 (variable up to 6:1).

In some embodiments, the resin can reach a state of "cure-to-handle" at room temperature within about 24 hours. However, the time can change depending on mass and ambient temperature. Embodiments of the resin can cure within about 36 to 72 hours, though this can be accelerated by the application of heat. Times and temperatures from 3 hours at 60° C. to 60 minutes at 100° C. can be achieved. In some embodiments, the resin can cure at room temperature. Upon curing, embodiments of the resin can form a tough, semi-rigid polymer that exhibits good wetting and adhesion to most surfaces. Further, the resin can be free flowing to penetrate voids and provide good air release, while offering good resistance to hard settling. Table 7 illustrates some of the cure schedule of embodiments of the resin.

TABLE 7

| Cure Schedule | |
| --- | --- |
| Pot Life, 200 grams @ 25° C. (77° F.) | 1 to 2 hours |
| Gel Time @ 25° C. (77° F.) | 8 to 10 hours |
| Handle Time @ 25° C. (77° F.) | 24 hours |
| Cure Time @ 25° C. (77° F.) | 36 to 72 hours (greater than or equal to 95% of full properties) |
| Heat Cure Time @ 60° C. (140° F.) | 2 to 4 hours |
| Heat Cure Time @ 100° C. (212° F.) | 60-90 minutes |

Example 1

An epoxy resin was prepared by mixing together 19.2 wt. % bisphenol F epoxy resin, 3.4 wt. % butyl glycidyl ether, 0.75 wt. % epoxy carbon black dispersion, 54 wt. % aluminum oxide, 3.4 wt. % phosphorous salt, 9 wt. % alumina trihydrate, and 2.3 wt. % ammonium poly phosphate. A curative/hardener was prepared by mixing together 6.8 wt. % polyglycol diamine and 1.4 wt. % polyamine blend. The epoxy resin and the hardener were then mixed together at a 10.00 to 1 weight mix ratio (or a 5:00 to 1 volume mix ratio) to form a resin which was poured in a container for curing. The mixed resin was then cured for 2 hours at 60° C. The cured epoxy had physical properties of a tensile strength of 6750 psi, a tensile modulus of 116700 psi, a compressive strength of 24000 psi, a shear strength of 5160 psi, an Izod impact of 1.2 ft. lbs./in, a relative temperature index for both impact and strength of 130° C. Further, the cured epoxy had thermal properties of a thermal conductivity of 0.70 W/(m·K) at 60° C. and an extrapolated coefficient of thermal expansion of 40 in/in/° C.×$10^{-6}$ (below Tg). In addition, the cured epoxy had electrical properties of a volume resistivity of 3.95×$10^{15}$ Ohm·cm, a relative temperature index for electrical of 130° C., a dielectric constant of 4.69 at 100 kHz and 4.80 at 1 MHz, and a dissipation factor of 0.017 at 100 kHz and 0.018 at 1 MHz. The properties achieved by an embodiment of the disclosed resin indicates that the disclosed resin has improved and advantageous physical, thermal, and electrical properties over other epoxies in the same class.

Applications of Disclosed Epoxy

Embodiments of the disclosed epoxy resin system can have many different uses. For example, the disclosed epoxy resin system can be used in:

Adhesives
Anti-Tampers
Coatings
Encapsulations
Environmental Protections
Intellectual Property Protections
Potting
Physical Security
Shock Management
Structural Reinforcement
Thermal Management
Tin Whisker Mitigation
Vibration Management The disclosed uses are not limiting, and the disclosed epoxy resin system can have other uses.

In some embodiments, the disclosed epoxy resin system can be used in:

Physical security of FIPS 140-2 Encrypted Devices
Banking/ATM Terminals
Entertainment devices
Hard Drives
Military Communication devices
Telecommunication devices
USB Flash Drives
Secure Data Networks
Environmental Protection of Electronics subjected to:
Waste Water
Salt
Humidity
Shock
Vibration
Chemicals
Temperature
UV
Transformers: Thermal Management and protection from harsh environments
Thermal Management and Fire Protection of Lithium Ion Battery packs
Automotive
Sensors
Control Circuitry
Marine Electronics The disclosed uses are not limiting, and the disclosed epoxy resin system can have other uses.

In some embodiments, the disclosed resin can be used with electronics and other electric systems. For example, the resin can be incorporated into motors, generators, transformers, switchgears, bushings, and insulators. As embodiments of the disclosed epoxy resin system can have excellent electrical resistance, the resin can be advantageous for covering electrical components to prevent shorting, and to keep particles like dust and moisture, out of the electrical components. Further, embodiments of the epoxy resin system can be used in the overmolding of integrated circuits, transistors, and hybrid circuits.

Figure 2:
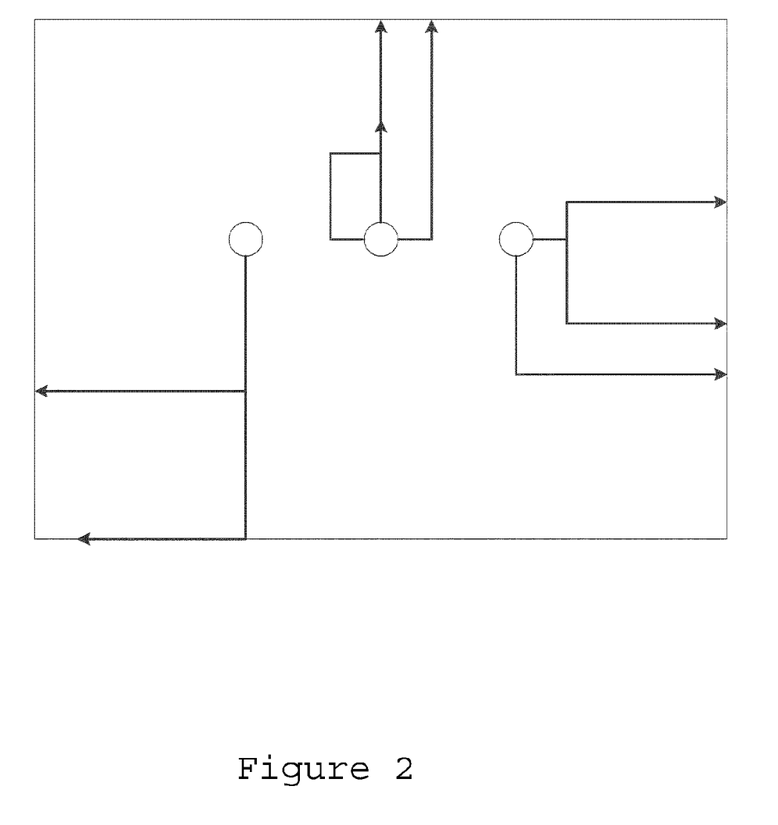
FIG. 2 shows an embodiment of a printed circuit board incorporating a cured epoxy.

The disclosed resin can be used in the potting and or encapsulation of electronics. In the potting process, the resin can fill an electronic component or assembly, thus reducing shock and vibration. The potted resin can also prevent moisture, dust, particles, and other corrosive elements from entering the electronic assembly. Embodiments of the disclosed resin can also have a high thermal conduction, and can having a higher thermal conduction then air. Accordingly, embodiments of the disclosed resin can be used for potting transformers and inductors, thereby reducing and/or eliminating hot spots, giving the transformers and inductors a stable and longer life than unspotted components. In some embodiments, the disclosed resin can be used for potting or encapsulating electronic components in a printed circuit board, such as shown in FIG. 2. The potted or encapsulated electrical components on the printed circuit board can withstand both indoor and outdoor environments without degradation.

In some embodiments, the resin can be used for casting. For example, the resin can be used for filling, sealing, covering, or soaking technical parts. In some embodiments, the resin can be used in casting electronic components, for example transformers and liquid crystal displays.

Embodiments of the disclosed resin can be used in many fields of interest. For example, embodiments of the disclosed epoxy resin system can be used in the fields of:

Telecommunications
Entertainment
Military
Advanced Physical Sciences
Nuclear Sciences
Consumer Products
Banking
Medical
Data Management
Commercial/Industrial Cargo Management
International Trade & Commerce The disclosed fields are not limiting, and the disclosed epoxy resin system can be used in other fields as well.

Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a claimed combination can, in some cases, be excised from the combination, and the combination may be claimed as any subcombination or variation of any subcombination.

Moreover, while methods may be depicted in the drawings or described in the specification in a particular order, such methods need not be performed in the particular order shown or in sequential order, and that all methods need not be performed, to achieve desirable results. Other methods that are not depicted or described can be incorporated in the example methods and processes. For example, one or more additional methods can be performed before, after, simultaneously, or between any of the described methods. Further, the methods may be rearranged or reordered in other implementations. Also, the separation of various system components in the implementations described above should not be understood as requiring such separation in all implementations, and it should be understood that the described components and systems can generally be integrated together in a single product or packaged into multiple products. Additionally, other implementations are within the scope of this disclosure.

Conditional language, such as "can," "could," "might," or "may," unless specifically stated otherwise, or otherwise understood within the context as used, is generally intended to convey that certain embodiments include or do not include certain features, elements, and/or steps. Thus, such conditional language is not generally intended to imply that features, elements, and/or steps are in any way required for one or more embodiments.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than or equal to 10% of, within less than or equal to 5% of, within less than or equal to 1% of, within less than or equal to 0.1% of, and within less than or equal to 0.01% of the stated amount.

While a number of embodiments and variations thereof have been described in detail, other modifications and methods for the same will be apparent to those of skill in the art. Accordingly, it should be understood that various applications, modifications, materials, and substitutions can be made of equivalents without departing from the unique and novel last next disclosed herein or the scope of the claims.

What is claimed is:

1. An uncured epoxy resin comprising:
   15-26 wt. % of at least one epoxy resin base reactive constituent, wherein the at least one epoxy resin base reactive constituent comprises bisphenol F epoxy resin;
   2-5 wt. % of diluent, wherein the diluent comprises butyl glycidyl ether;
   0.5-1.5 wt. % of at least one color pigment;
   40-60 wt. % of at least one thermally conductive filler, wherein the at least one thermally conductive filler comprises aluminum oxide;
   2.5-4.0 wt. % of at least one reactive constituent, wherein the at least one reactive constituent comprises phosphorous salt;
   8.5-16 wt. % of at least one flame retardant, wherein the at least one flame retardant comprises 7%-12% alumina trihydrate and 1.5%-4% ammonium poly phosphate;
   5-10 wt. % of at least one reactive agent, wherein the at least one reactive agent comprises polyglycol diamine; and
   1-3 wt. % catalyst, wherein the catalyst comprises a polyamine blend.

2. The uncured epoxy resin system of claim 1, wherein the viscosity of the resin is 3,500-4500 cP mixed measured at 24° C.

3. A cured epoxy formed from the uncured epoxy resin of claim 2.

4. The cured epoxy resin of claim 3, wherein the cured resin has a thermal conductivity of 0.70 W/(m·K) at 60° C.

5. The cured epoxy resin of claim 3, wherein the cured resin has a volume resistivity of $3.95 \times 10^{15}$ ohm·cm.

6. The cured epoxy resin of claim 3, wherein the cured resin has a relative temperature index for impact, strength, and electrical of 130° C.

7. The cured epoxy resin of claim 3, wherein the cured resin has a 200 g. pot life of 1 to 2 hours at 25° C.

8. The uncured epoxy resin of claim 1, wherein the aluminum oxide has a mesh size of less than 50 Mesh.

9. The uncured epoxy resin of claim 1 comprising:
   about 17.2%-21.2% bisphenol F epoxy resin;
   about 2.4%-4.4% butyl glycidyl ether;
   about 0.5%-1.0% color pigment;
   about 51%-57% aluminum oxide;
   about 2.5%-4% phosphorous salt;
   about 7%-11% alumina trihydrate;
   about 1.5%-3.3% ammonium poly phosphate;
   about 5%-8.8% polyglycol diamine; and
   about 1%-1.9% of polyamine blend.

10. The uncured epoxy resin of claim 9 comprising:
    about 19.2% bisphenol F epoxy resin;
    about 3.4% butyl glycidyl ether;
    about 0.75% color pigment;
    about 54% aluminum oxide;
    about 3.4% phosphorous salt;
    about 9% alumina trihydrate;
    about 2.3% ammonium poly phosphate;
    about 6.8% polyglycol diamine; and
    about 1.4% of polyamine blend.

11. The uncured epoxy resin of claim 1, the uncured epoxy resin consisting essentially of:
    about 15%-26% bisphenol F epoxy resin;
    about 2%-5% butyl glycidyl ether;
    about 0.5%-1.5% color pigment;
    about 40%-60% aluminum oxide;
    about 2.5%-4% phosphorous salt;
    about 7%-12% alumina trihydrate;
    about 1.5%-4% ammonium poly phosphate;
    about 5%-10% polyglycol diamine; and
    about 1%-3% of polyamine blend.

12. The uncured epoxy resin of claim 11, the uncured epoxy resin consisting essentially of:
    about 19.2% bisphenol F epoxy resin;
    about 3.4% butyl glycidyl ether;
    about 0.75% color pigment;
    about 54% aluminum oxide;
    about 3.4% phosphorous salt;
    about 9% alumina trihydrate;
    about 2.3% ammonium poly phosphate;
    about 6.8% polyglycol diamine; and
    about 1.4% of polyamine blend.

13. An uncured epoxy resin consisting essentially of, in wt. %:
    about 15%-26% bisphenol F epoxy resin;
    about 2%-5% butyl glycidyl ether;
    about 0.5%-1.5% of at least one color pigment;
    about 40%-60% aluminum oxide;
    about 2.5%-4% phosphorous salt;
    about 7%-12% alumina trihydrate;
    about 1.5%-4% ammonium poly phosphate;
    about 5%-10% polyglycol diamine; and
    about 1%-3% of polyamine blend.

14. The uncured epoxy resin of claim 13, the uncured epoxy resin consisting essentially of:
    about 19.2% bisphenol F epoxy resin;
    about 3.4% butyl glycidyl ether;
    about 0.75% color pigment;
    about 54% aluminum oxide;
    about 3.4% phosphorous salt;
    about 9% alumina trihydrate;
    about 2.3% ammonium poly phosphate;
    about 6.8% polyglycol diamine; and
    about 1.4% of polyamine blend.

15. The uncured epoxy resin of claim 13, wherein the viscosity of the resin is 3,500-4,500 cP mixed measured at 24° C.

16. The uncured epoxy resin of claim 13, wherein the aluminum oxide has a mesh size of less than 50 Mesh.

17. A cured epoxy formed from the uncured epoxy resin of claim 13.

18. The cured epoxy resin of claim 17, wherein the cured resin has a thermal conductivity of 0.70 W/(m·K) at 60° C.

19. The cured epoxy resin of claim 17, wherein the cured resin has a volume resistivity of $3.95 \times 10^{15}$ ohm·cm.

20. The cured epoxy resin of claim 17, wherein the cured resin has a relative temperature index for impact, strength, and electrical of 130° C.

21. The cured epoxy resin of claim 17, wherein the cured resin has a 200 g. pot life of 1 to 2 hours at 25° C.

* * * * *